United States Patent [19]
Choi

[11] Patent Number: 5,418,177
[45] Date of Patent: May 23, 1995

[54] PROCESS FOR FORMATION OF MEMORY CELL WHERE CAPACITOR IS DISPOSED BELOW A TRANSISTOR

[75] Inventor: Jong M. Choi, Chungcheongbuk-do, Rep. of Korea

[73] Assignee: Goldstar Electron Co., Ltd., Cheongju-si, Rep. of Korea

[21] Appl. No.: 207,769

[22] Filed: Mar. 7, 1994

[30] Foreign Application Priority Data

Mar. 22, 1993 [KR] Rep. of Korea ............... 93-4375

[51] Int. Cl.$^6$ ............... H01L 21/70; H01L 27/00
[52] U.S. Cl. ............... 437/52; 437/47; 437/60; 437/919
[58] Field of Search ............... 437/47, 52, 60, 919; 257/306

[56] References Cited

U.S. PATENT DOCUMENTS

| | | | |
|---|---|---|---|
| 5,113,235 | 5/1993 | Tamakoshi | 357/23.4 |
| 5,272,103 | 12/1993 | Nakamura | 437/52 |
| 5,292,677 | 3/1994 | Dennison | 437/52 |

*Primary Examiner*—Olik Chaudhuri
*Assistant Examiner*—H. Jey Tsai
*Attorney, Agent, or Firm*—Alan R. Loudermilk

[57] ABSTRACT

A semiconductor memory cell and a process for formation thereof is disclosed. A capacitor is disposed below a transistor, so that a DRAM cell that may be suitable for a high density semiconductor device is produced. A semiconductor device according to the present invention includes: a buried capacitor consisting of a storage electrode, a dielectric layer and a plate electrode formed on a substrate in a planar form; and a transistor formed above the capacitor, a source/drain region of the transistor being connected to the storage electrode of the capacitor.

18 Claims, 3 Drawing Sheets

PROCESS FOR FORMATION OF MEMORY CELL WHERE CAPACITOR IS DISPOSED BELOW A TRANSISTOR

FIELD OF THE INVENTION

The present invention relates to a semiconductor memory cell and a process for formation thereof, and more particularly to a memory cell in which a planar capacitor is disposed below a transistor and which is suitable for a high density semiconductor device.

BACKGROUND OF THE INVENTION

Generally, memory cells of widely used DRAM (dynamic random access memory) devices consist of a capacitor and a transistor. Of such DRAM memory cells, the process for forming a memory cell using a stacked type capacitor will be described as an example.

First, as illustrated in FIG. 1A, oxide layer 2 and nitride layer 3 are successively formed upon semiconductor substrate 1. Then, photo resist is coated on the surface, and a photo-masking process is carried out to form active region pattern 4. Then, as illustrated in FIG. 1B, in order to form an isolating layer, nitride layer 3 and oxide layer 2 are etched by using active region pattern 4 of the photo resist as a mask. The photo resist is removed and field ion implantation 5 is performed. As illustrated in FIG. 1C, an oxidation process is carried out to form isolating layer 6. Then, nitride layer 3 and oxide layer 2 are removed, and an ion implantation is performed for adjusting the threshold voltage.

After completion of this process, as illustrated in FIG. 1D, gate insulating layer 7 is formed on the surface, and polysilicon layer 8 and inter-layer insulating layer 9 composed of silicon oxide are successively deposited for a gate electrode. Then photo resist is coated thereupon, and photo resist pattern 10 is formed through a photo masking process for forming the gate of a transistor.

As illustrated in FIG. 1E, inter-layer insulating layer 9, polysilicon layer 8 and gate insulating layer 7 are successively removed by carrying out an anisotropic etching using photo resist pattern 10 as a mask, thereby forming a gate electrode. Then, impurity ions are implanted to form a lightly doped drain (LDD) region, and an oxide layer is deposited and etched back to form side walls 11 on the sides of the gate electrode. Then an ion implantation is carried out to form a highly doped source/drain region.

Then inter-layer insulating layer 12 is formed, and a contact hole is opened in order to form a contact region which is to be contacted with a node electrode of the capacitor. Then polysilicon is deposited for forming a storage electrode of the capacitor, and node electrode 13, which is the storage electrode, is formed by applying a photo etching process. Dielectric film 14 is coated on the surface of the node electrode, and then plate electrode 15 is formed thereupon. After the completion of the above process, BPSG 16 is formed and spread to flatten the surface, and then metallization layer 17 is formed.

In the conventional stacked type semiconductor memory cell as described above, the capacitance of the capacitor is decided by the surface area, which is decided by the thickness and shape of the storage electrode, There is a limit, however, to the increase of the capacitance, and the stacked contour makes it difficult to carry out the flattening process.

In a modified stacked cell structure in which the shape of the capacitor is varied in various contours, an increase in the capacitance can be achieved to some degree. Due to the complicated nature of the structure, however, short circuits can occur between the node electrode and the plate electrode of the capacitor, with the result that the yield is lowered. Further, the process margin is decreased, so that many problems may be encountered during the formation of the semiconductor device.

SUMMARY OF THE INVENTION

The present invention is intended to overcome the above described disadvantages of the conventional techniques.

Therefore, it is an object of the present invention to provide a semiconductor memory cell and a process for formation thereof, in which a planar capacitor is formed below the transistor of the DRAM cell so as for the topology to be improved, and the six faces of the storage node, i.e., the front, rear, left, right, top and bottom of the storage node, are made to be surrounded by a dielectric layer and a plate electrode, thereby greatly increasing the capacitance of the capacitor.

Further, the transistor is made of thin semiconductor films, and, therefore, the leakage current between the source and drain is markedly reduced, whereby the reliability of the semiconductor device is greatly improved.

In achieving the above object, the process for formation of the semiconductor memory cell according to the present invention includes the steps of: forming a first dielectric layer on a semiconductor substrate, forming a first semiconductor layer on the first dielectric layer, and etching the first semiconductor layer by applying a photo etching process to form a storage electrode; forming a second dielectric layer on the surface of the storage electrode and the substrate, and forming a second semiconductor layer on the whole surface to form a plate electrode; forming an insulating layer on the plate electrode, and opening a contact hole on the portion where the storage electrode is to be connected; forming a dielectric layer on the whole surface, and carrying out an anisotropic etching to form a third dielectric layer on the sides of the contact hole; depositing a third semiconductor layer on the contact hole, etching it back to form a plug to be connected to the storage electrode, and forming a fourth semiconductor layer on the overall surface; and forming an element to be connected to the storage electrode on the fourth semiconductor layer.

The first to third semiconductor layers may be comprised of doped polysilicon, while the first to third dielectric layers may be comprised of silicon oxide. Further, the first to third dielectric layers may be a stacked structure consisting of a silicon oxide layer and a silicon nitride layer. The substrate is a silicon substrate in which the top portion is doped with a high concentration impurity. Alternatively, the substrate may be that in which an insulating layer is formed on a silicon substrate.

In achieving the above object, the semiconductor memory cell according to the present invention includes: a buried capacitor consisting of a storage electrode, a dielectric layer and a plate electrode formed on a substrate in a planar form; and a transistor formed above the capacitor, a source/drain region of the transistor being connected to the storage electrode of the capacitor. The capacitor includes: a first dielectric layer formed on the semiconductor substrate in a planar form; a storage electrode consisting of a first semiconductor layer formed on the first dielectric layer; a second dielectric layer formed on the surface of the storage electrode; a plate electrode formed on the second dielectric layer; an insulating layer formed on the plate electrode; and a plug passing through the insulating layer and the plate electrode, insulated from the plate electrode, electrically connected to the storage electrode, and connected to the source/drain region of the transistor.

Further, if a stacked type capacitor is formed upon the transistor, a greater capacitance may be obtained.

According to another aspect of the present invention, a process for formation of the semiconductor memory cell, comprises the steps of: forming a first conductive layer on a substrate, and selectively etching the first conductive layer to form a first storage electrode; forming a first dielectric layer on the substrate including the first storage electrode; forming a second conductive layer on the first dielectric layer to form a plate electrode; forming an insulating layer on the plate electrode, and opening a contact hole to the first storage electrode; forming a second dielectric layer on the side of the contact hole; forming a third conductive layer in the contact hole to form a second storage electrode; forming a semiconductor layer on the whole surface; forming a field isolating layer in the semiconductor layer; forming a gate electrode on the semiconductor layer; forming impurity regions at the sides of the gate electrode in the semiconductor layer.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

FIGS. 2A to 2E are partly sectional views of a cell portion for illustrating the process for formation of a semiconductor memory cell according to the present invention.

Figure 1A:
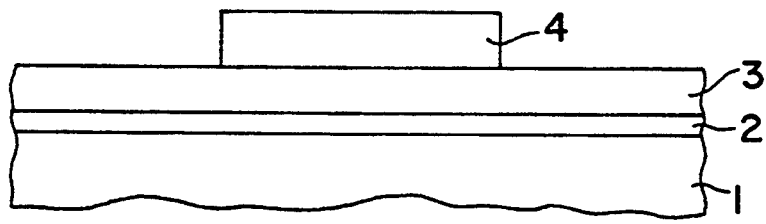
FIGS. 1A to 1E are partly sectional views illustrating a conventional semiconductor memory cell.
Figure 1B:
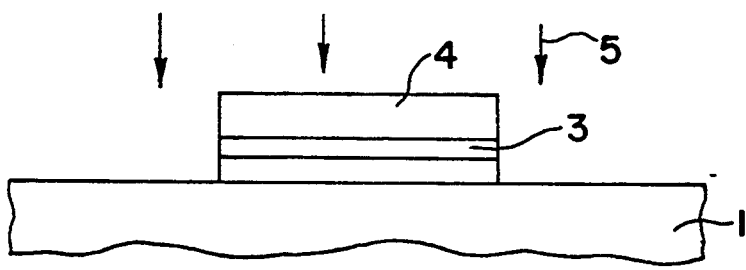
Figure 1C:
Figure 1D:
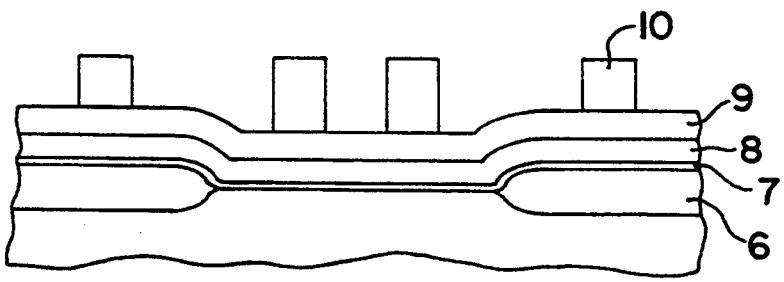
Figure 1E:
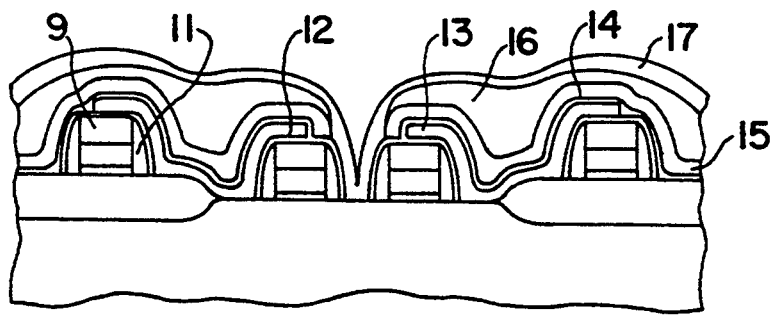
Figure 2A:
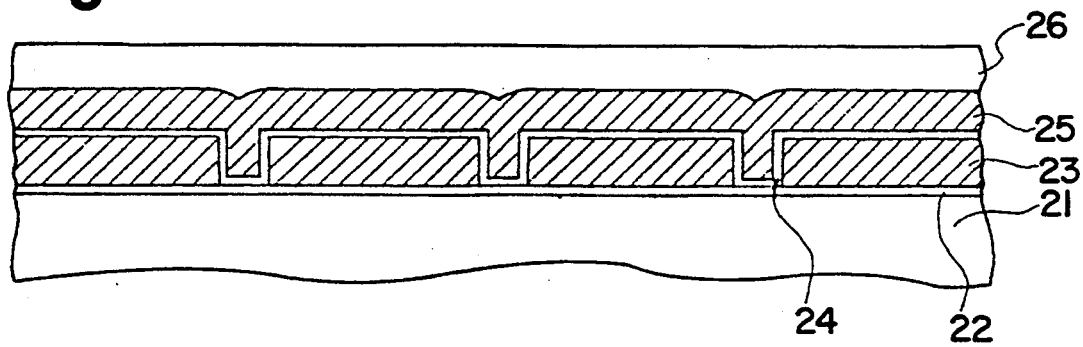
FIGS. 2A to 2E are partly sectional views illustrating the process for formation of a semiconductor memory cell according to the present invention.

First, as illustrated in FIG. 2A, first dielectric layer 22 is formed to a thickness of about 30 to 150 Angstroms upon substrate 21. Then, a first semiconductor layer is deposited to a thickness of about 1000 to 4000 Angstroms, and storage electrode 23 is formed by applying a photo etching method. Then, second dielectric layer 24 is formed to a thickness of about 30 to 150 Angstroms, so that storage electrode 23 is completely surrounded by a dielectric layer.

A second semiconductor layer is deposited to a thickness of about 1000 to 3000 Angstroms for forming plate electrode 25 of the capacitor. In other embodiments, the second semiconductor layer instead may be formed of a suitable metallic material. Then, insulating layer 26 is formed to a thickness of about 500 to 3000 Angstroms on plate electrode 25. Insulating layer 26 may be comprised of silicon oxide and silicon nitride.

Substrate 21, which is a semiconductor layer, is doped with p type or n type impurities to make it a conductor. Alternatively, substrate 21 may be an insulating layer.

Figure 2B:
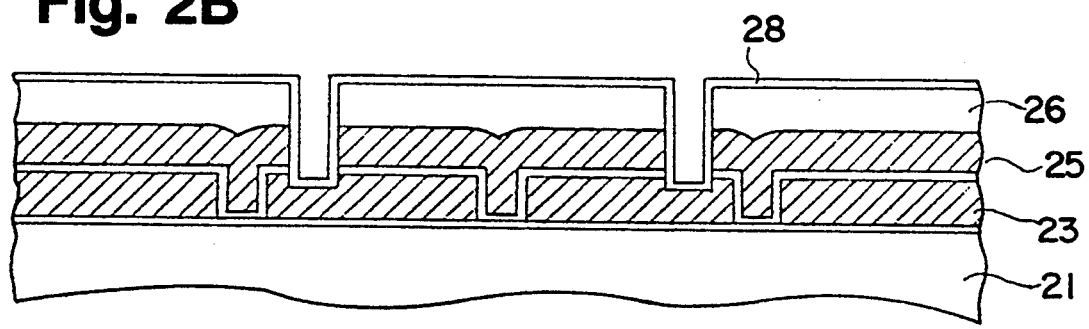

Then, as illustrated in FIG. 2B, a contact hole is defined by applying a photo etching method in order to connect to storage electrode 23 of the capacitor and to connect to a source/drain region of a transistor. Insulating layer 26 is etched, and then the plate electrode and the second dielectric layer are etched by using the remaining portions of the insulating layer as a mask. The relevant portion of storage electrode 23 is etched to form a contact hole. Then, third dielectric layer 28 is deposited to a thickness of about 30 to 150 Angstroms on the overall surface. The first, second and third dielectric layers may be comprised of one selected from among a thermal oxidation layer, a CVD oxide layer, or a nitride layer, or they may be a stacked structure consisting of an oxide layer and a nitride layer.

Figure 2C:
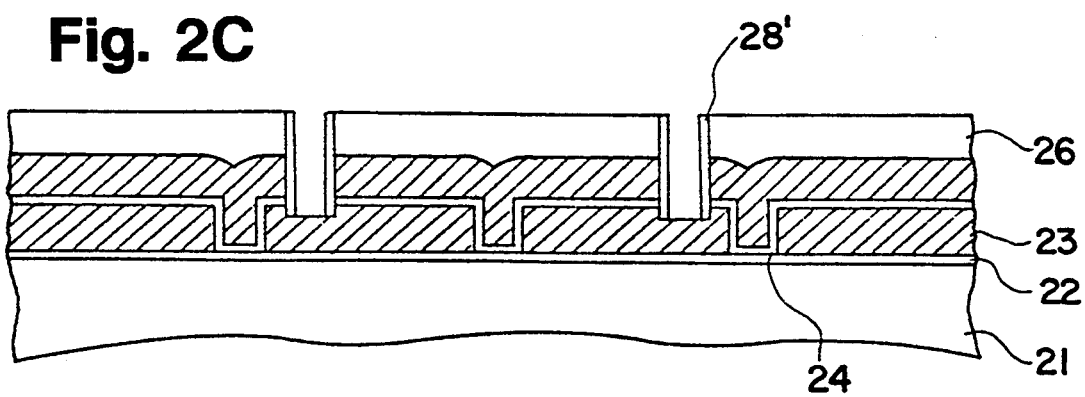
Figure 2D:
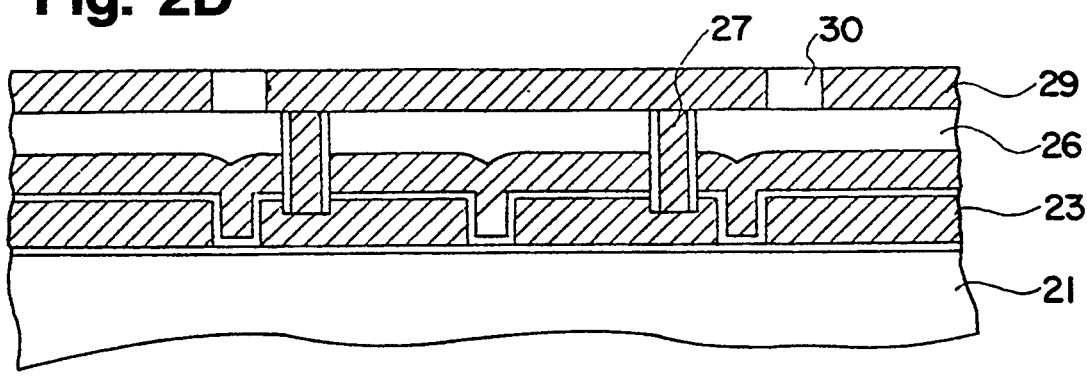

Then, as illustrated in FIG. 2C, third dielectric layer 28 is anisotropically etched without using a mask, so that residual third dielectric layer 28' remains on the side walls of the contact hole. As illustrated in FIG. 2D, a third conductive layer is deposited and etched back, so that plug 27 is formed of the third conductive layer to fill the contact hole. Then, thereupon fourth semiconductor layer 29 is deposited to a suitable thickness. In order to isolate the elements, fourth semiconductor layer 29 is partly oxidized, so that element isolating layers 30 are formed for isolating adjacent elements from each other.

The first, second, third and fourth semiconductor layers may be comprised of polysilicon, and the first, second and third semiconductor layers are doped with a high concentration, while the fourth semiconductor layer is not doped or doped with a very low concentration.

Figure 2E:
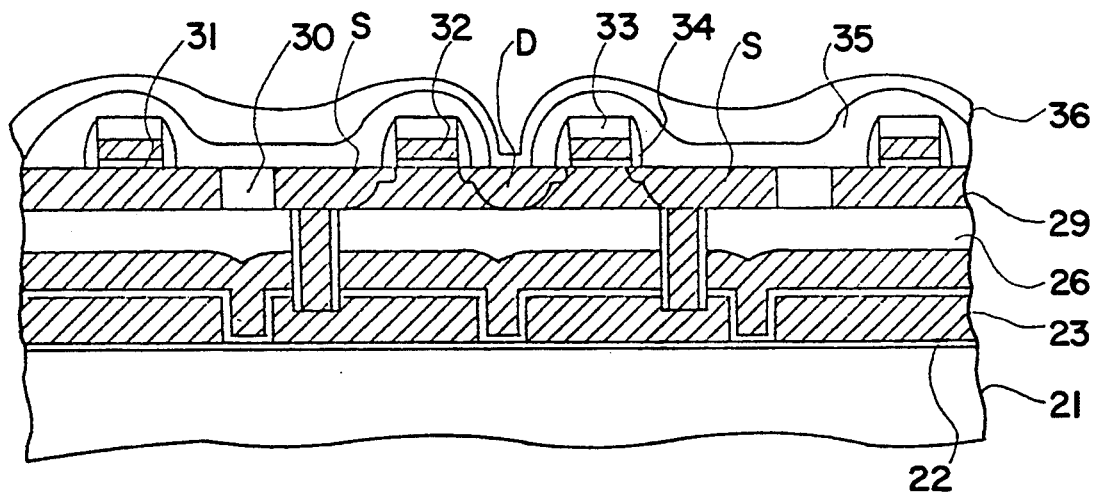

Then, as illustrated in FIG. 2E, based on the conventional process, gate insulating layer 31, gate electrode polysilicon layer 32 and gate upper insulating layer 33 are successively deposited and etched back to form a gate electrode. Then an ion implantation is carried out to form source S and drain D. An oxide layer is deposited on the whole surface, and etched back, so that side walls 34 are formed on the gate. A further ion implantation may be performed to produce the source/drain region as illustrated. Then BPSG 35 is formed and spread to flatten the surface, and a contact hole is formed on the portion where a connection is to be made to a metal wiring. Then conductive metallic layer 36 is deposited and patterned, thereby completing the formation of the memory cell.

The process after formation of the element isolating insulating layer on the third semiconductor layer as shown in FIG. 2D may be the general transistor formation process. This process may be carried out based on known methods. The portion which is connected with plug 27, however, should form a circuit portion which is connected to the storage electrode of the capacitor.

Further, the substrate and the second semiconductor layer may be electrically connected together, so that the substrate may be used as a part of the plate electrode, thereby increasing the efficiency.

As another embodiment, after formation of the planar capacitor below semiconductor layer 29 on which a transistor is to be formed, a stacked type capacitor as described referring to FIGS. 1A to 1E may be formed, so that one DRAM cell may have two capacitors, thereby increasing the capacitance of the capacitor.

According to the present invention as described above, not a stacked capacitor but a planar capacitor is formed below the transistor, and the storage node electrode is formed to be completely surrounded by a dielectric layer and a plate electrode, so that the capacitance may be greatly increased. Further, the cell is made of thin transistor layers, and the gate is surrounded by an insulating layer, so that the leakage current between the source and drain may be markedly reduced, thereby improving the reliability of the semiconductor memory device.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for formation of a semiconductor memory cell, comprising the steps of:
    forming a first conductive layer on a substrate, and selectively etching the first conductive layer to form a first storage electrode;
    forming a first dielectric layer on the substrate and on the first storage electrode;
    forming a second conductive layer on the first dielectric layer to form a plate electrode;
    forming an insulating layer on the plate electrode, and opening a contact hole to the first storage electrode;
    forming a second dielectric layer on the sides of the contact hole;
    forming a third conductive layer in the contact hole;
    forming a semiconductor layer on the surface of the resulting structure;
    forming a field isolating layer in portions of the semiconductor layer;
    forming a gate electrode on the semiconductor layer;
    forming impurity regions at the sides of the gate electrode in the semiconductor layer.

2. The method as claimed in claim 1, wherein the first, second and third conductive layers are comprised of doped polysilicon.

3. The method as claimed in claim 1, wherein the insulating layer and the first and second dielectric layers are comprised of oxide.

4. The method as claimed in claim 1, wherein the first and second dielectric layers comprise a stacked structure comprising an oxide layer and a nitride layer.

5. The method as claimed in claim 1, wherein the substrate has an insulating layer formed on the-surface thereof.

6. The method as claimed in claim 1, wherein the substrate comprises silicon.

7. The method as claimed in claim 1, wherein the second conductive layer comprises a metallic material.

8. The method as claimed in claim 1, wherein an additional process step is added to electrically connect the substrate to the second conductive layer.

9. The method as claimed in claim 8, wherein the substrate is a silicon substrate doped with an impurity.

10. A process for formation of a semiconductor memory cell, comprising the steps of:
    forming a first dielectric layer on a semiconductor substrate, forming a first semiconductor layer on the first dielectric layer, and etching the first semiconductor layer to form a storage electrode;
    forming a second dielectric layer on the surface of the storage electrode, and forming a second semiconductor layer on the surface to form a plate electrode;
    forming an insulating layer on the plate electrode, and opening a contact hole on the portion where the storage electrode is to be connected;
    forming a dielectric layer on the whole surface, and carrying out an anisotropic etching to form a third dielectric layer on the sides of the contact hole;
    forming a conductive layer in the contact hole, etching it back to form a plug to connect to the storage electrode, and forming a third semiconductor layer on the surface of the resulting structure; and
    forming a circuit portion to be connected to the storage electrode on the third semiconductor layer.

11. The process as claimed in claim 10, wherein the first, second and third semiconductor layers are comprised of doped polysilicon.

12. The process as claimed in claim 10, wherein the insulating layer comprises CVD oxide, and the first, second and third dielectric layers comprise silicon oxide.

13. The process as claimed in claim 10, wherein the first, second and third dielectric layers comprise a stacked structure comprising a silicon oxide layer and a silicon nitride layer.

14. The process as claimed in claim 10, wherein the substrate comprises a silicon substrate doped with an impurity.

15. The process as claimed in claim 10, wherein the substrate comprises a silicon substrate on which an insulating layer is formed.

16. The process as claimed in claim 10, wherein the contact hole is formed by etching down to a part of the storage electrode of the capacitor.

17. The process as claimed in claim 10, wherein the second semiconductor layer comprises a doped material.

18. The process as claimed in claim 10, wherein an additional process step is added to electrically connect the substrate to the second semiconductor layer.

* * * * *